United States Patent
Miyagawa

(10) Patent No.: US 6,717,740 B2
(45) Date of Patent: Apr. 6, 2004

(54) SCANNING OPTICAL SYSTEM AND IMAGE RECORDING EXPOSURE DEVICE

(75) Inventor: Ichirou Miyagawa, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/066,567

(22) Filed: Feb. 6, 2002

(65) Prior Publication Data

US 2002/0109924 A1 Aug. 15, 2002

(30) Foreign Application Priority Data

Feb. 7, 2001 (JP) ........................... 2001-031400

(51) Int. Cl.$^7$ ................ G02B 15/14; G02B 27/10; G02B 9/00; G02B 7/02
(52) U.S. Cl. ................ 359/676; 359/618; 359/662; 359/740; 359/823
(58) Field of Search ................ 359/676, 618, 359/662, 694, 738–740, 823, 204, 635

(56) References Cited

U.S. PATENT DOCUMENTS

| | | | | |
|---|---|---|---|---|
| 4,390,235 A | * | 6/1983 | Minoura | ............ 359/204 |
| 5,469,290 A | * | 11/1995 | Maeda | ............ 359/210 |
| 5,526,166 A | * | 6/1996 | Genovese | ............ 359/204 |
| 5,745,153 A | * | 4/1998 | Kessler et al. | ............ 347/241 |
| 6,459,520 B1 | * | 10/2002 | Takayama | ............ 359/204 |

* cited by examiner

*Primary Examiner*—Georgia Epps
*Assistant Examiner*—William Choi
(74) *Attorney, Agent, or Firm*—Sughrue Mion, PLLC

(57) ABSTRACT

An optical system for scanning, which can prevent the depth of focus from decreasing when magnification of the optical system is changed, especially when the magnification is increased. In this optical system, a zoom lens and a focus lens are arranged between a light source for emitting light beams and a scanning and focusing surface. In accordance with a desired resolution, an aperture is arranged at a position at which a far-field pattern is formed. When the magnification of the optical system is increased by the zoom lens, a luminous flux is widened, and a converging angle formed by the focus lens is also widened. However, since the aperture shields the luminous flux by an amount by which the converging angle has been widened, the converging angle is the same as that when an image is recorded at low resolution. Hence, the depth of focus can be maintained.

20 Claims, 7 Drawing Sheets

CHARACTERISTIC SHOWING A RELATIONSHIP BETWEEN OPENING RADIUS AND TRANSMISSIVITY

TRANSMISSIVITY T

RADIUS r

SCANNING OPTICAL SYSTEM AND IMAGE RECORDING EXPOSURE DEVICE

BACKGROUND OF THE INVENTION

1. Field of the Invention

The present invention relates to an optical system for scanning light beams, and an image recording exposure device for recording an image on an exposure surface by performing simultaneous multiple main-scans on the exposure surface.

2. Description of the Related Art

In a conventional image recording device, an image is recorded on a photosensitive material by disposing at a predetermined distance scan-units facing a portion of the circumferential surface of a cylindrical drum (outer drum), carrying out main-scanning on a surface of the photosensitive material by high speed rotation in a state in which the photosensitive material is wrapped around the circumferential surface of the cylindrical drum and, during this high speed rotation of the drum, carrying out sub-scanning on the surface of the photosensitive material by moving the scan-units in an axis direction of the drum while maintaining the distance of the scan-units. In this image recording device, it has been considered that a plurality of light sources (a light source having a broad light emission area structured by point light sources arranged in at least one direction) is arranged at the scan-units, and light beams transmitted from the light sources are arranged in a sub-scanning direction to thereby record an image on the photosensitive material while forming main-scan lines simultaneously. As a result, high speed processing is made possible.

Further, the aforementioned light sources are useful when a light source which emits light with high energy is needed, such as with a thermal photosensitive material.

In such an image recording device, when a distance between the spots of respective light beams is changed (switched) in accordance with a desired resolution, it becomes necessary to change the magnification of an exposure lens which is arranged at each scan-unit.

During this process, when the magnification of the exposure lens is made higher, a converging angle that is formed by light beams which are condensed (focused) on an image recording surface (scanning surface) becomes larger, and a depth of focus which is acceptable for the exposure decreases.

FIGS. 9A to 9D show an example of an optical system for explaining the change of the depth of focus.

As shown in FIG. 9A, a divergent light which is emitted from a light source 100 is changed to a parallel light at a first lens 102, and is focused through a second lens 104 onto a scan surface 106. At this point, the light beams form a converging angle $\theta_1$.

FIG. 9B shows an enlarged view of a focus point at this time. An allowable spot diameter (beam diameter) d1 is defined, and thus a width (focal depth L1) for obtaining this allowable spot diameter d1 is determined.

FIG. 9C shows a state in which the magnification is made higher by moving the second lens 104 in the direction of an optical axis (the imaginary line position in FIG. 9C shows the state of FIG. 9A).

At this time, it is noted that a converging angle $\theta_2$ formed by the light beams which are condensed by the second lens 104 is greater than the converging angle $\theta_1$.

FIG. 9D shows an enlarged view of the focus point at this time. A width (depth of focus L2) for obtaining a defined allowable spot diameter d2 (which equals d1) is smaller than L1.

In order to solve this problem, removing any other expected factors that may cause errors (even when the depth of focus is low) can be considered. The any other factors that may cause errors include eccentricity of the outer drum, an amount by which image surfaces of the scan-units are curved, and the like.

Mitigation of such errors depends on accuracy with which mechanical parts are manufactured, accuracy with which the same are assembled, and complicated control of the device, so that the manufacturing cost of the device becomes high. This is particularly unsuitable for image recording devices which are desired to be manufactured inexpensively.

Due to the introduction of AF (auto-focus) mechanisms, the aforementioned accuracy requirement can be eased. However, the AF mechanism is deficient in reliability because of a problem with responsiveness. Moreover, because control of the AF mechanism itself is complicated, it is difficult to solve the problem of high manufacturing costs.

SUMMARY OF THE INVENTION

In view of the aforementioned facts, an object of the present invention is to obtain a scanning optical system having a simple structure, capable of preventing depth of focus from decreasing when magnification of the optical system is changed, especially when the magnification is increased, and capable of scanning while maintaining a range of acceptable spot diameter for all magnifications.

Another object of the present invention is to obtain an image recording exposure device which has an optical system for simultaneously scanning multiple light beams and in which, even with a change of resolution, the depth of focus can be maintained without causing a reduction of light amount, such that a spot diameter being scanned on a recording surface is kept within an acceptable range.

A first aspect of the present invention is an optical system for use in scanning a surface, the optical system comprising: a light source which emits a light beam; a group of lenses which condenses the light beam emitted from the light source to a surface to be scanned; a magnification changer for changing magnification of the group of lenses; and an aperture provided on an optical path of the light beam and having an opening in which only a portion of the light beam is transmitted therethrough.

A second aspect of the present invention is an optical system for use in scanning a surface, the optical system comprising: a light source including a broad light emission area comprising point-like light sources arranged in at least one direction; a lens group which condenses a light beam emitted from the light source to a surface to be scanned; a magnification changer which moves at least one lens of the lens group along an optical axis direction of the light beam for changing magnification of the lens group; and an aperture provided on an optical path of the light beam and including an opening which transmits only a portion of the light beam therethrough.

In accordance with the first and second aspects of the present invention, an amount of the luminous flux corresponding to an amount of widening of a converging angle at a converging point, due to an increase of magnification, is shielded by the aperture. Thus, the luminous flux that reaches the scanning surface forms almost the same converging angle as before the increase of magnification. Consequently, depth of focus can be prevented from decreasing.

For this case, intensity distribution of a laser beam L at a position at which an aperture is arranged is shown in FIG.

1. The intensity distribution has a mountain-like characteristic whose central portion is the highest intensity and which deteriorates toward a periphery (foot of the mountain). Thus, if a peripheral edge portion of this intensity distribution is shielded by an aperture, the total light amount does not decrease in direct proportion to the area shielded by the aperture.

As shown in FIG. 2, assuming a Gaussian distribution, a radius of an opening portion 28 of an aperture arranged on an optical path of r, a light amount of $1/e^2$, and the radius r and a light transmissivity T each normalized as 1, when the aperture opens at a radius r other than 1, a light amount ratio of the radius r to the light transmissivity T has a relationship close to a direct proportion. When the radius r is ½ (i.e., the area is ¼), the light amount is also ½.

If the magnification is increased, regardless of the shape of the opening portion, a total light amount in a broad area direction is subjected to basic geometry, a converging spot diameter becomes smaller, and the light amount in unit area increases. If the broad area direction corresponds to the sub-scanning direction, the converging spot diameter in the sub-scanning direction becomes smaller, and thus the peak value of the light amount increases substantially linearly (when the converging spot diameter is ½, the peak value is almost double). Thus, the decrease of the light amount is offset, so the light amount is hardly affected by the aperture.

In order to record an image at higher resolution, the line width must be narrower by an amount in accordance with a desired resolution. When a broad area light source is used, the converging spot diameter becomes smaller. By contrast, in the case of a coherent light source (point light source), when the aperture is made larger, the spot diameter only changes a little, and it is difficult to obtain the effect described above. Further, the peak value of the light amount decreases in correspondence with an amount by which the aperture is closed.

In accordance with the first and second aspects of the present invention, multiple light beams are irradiated from the light source at one time. The aperture can be arranged on a far-field pattern of the light beams or in the vicinity thereof.

By arranging the aperture on the far-field pattern of the light beams or in the vicinity thereof, each of the light beams is uniformly shielded by the aperture at the peripheral edge portion of the luminous flux. Accordingly, differences between light amounts of the respective light beams are not caused.

In accordance with the first and second aspects of the present invention, the aperture may be arranged at a downstream side of any lenses which move along the optical axis direction during a change of the magnification, and so the opening area of the aperture can be made constant.

The opening area of the aperture can be made constant because the region of the luminous flux is not changed.

Further, in accordance with the first and second aspects of the present invention, the aperture may be arranged at an upstream side of the lenses which move along the optical axis direction during a change of the magnification, and the opening area of the aperture can be changed in accordance with the changed magnification.

Because the aperture is arranged at the upstream side of the lenses which move along the optical axis direction, the region of the luminous flux is changed. Therefore, in order to fix the proportion of the region of the luminous flux that is shielded by the aperture, depth of focus can be appropriately maintained in all magnifications by changing the opening area substantially linearly in accordance with the magnification.

A third aspect of the present invention is an image recording exposure device for recording an image on an exposure surface by simultaneously carrying out multiple main-scans on the exposure surface, the device comprising: light sources arranged in a row in a sub-scanning direction and capable emitting multiple light beams simultaneously; exposure lenses including multiple lenses for focusing light beams emitted from the light sources onto the exposure surface along an optical path, at least two exposure lenses being disposed at positions different from one another on the optical path; a magnification changer for changing magnification of the exposure lenses; and an aperture disposed between the positions at or in the vicinity position at which a far-field pattern is formed by the emitted light beams, the aperture having an opening of constant area which transmits only a portion of luminous flux of the light beams therethrough, wherein the exposure lenses include lenses for changing the magnification disposed between the aperture and the light sources.

The third aspect of the present invention is an image recording exposure device to which the optical system for scanning according to the second aspect of the present invention has been applied. This aspect of the invention has the same operation and effects as those of the first aspect and the second aspect of the present invention (see FIG. 1 and FIG. 2).

The magnification is changed when resolution is to be changed. For example, if the resolution in the sub-scanning direction is doubled, the speed in the sub-scanning direction is ½ and if the light amount is also ½, the amount of light which is exposed onto the scan-surface does not change. Consequently, no problem of insufficient light amounts is caused by the arrangement of the aperture.

Of the group of lenses, a lens system for changing the magnification is arranged between the aperture and the light source. Accordingly, the region of the luminous flux is not changed, and so the opening area of the aperture can be made constant.

A fourth aspect of the present invention is an image recording exposure device for recording an image on an exposure surface by simultaneously carrying out multiple main-scans on the exposure surface, the device comprising: light sources arranged in a row in a sub-scanning direction and capable emitting multiple light beams simultaneously; exposure lenses including multiple lenses for focusing light beams emitted from the light sources onto the exposure surface along an optical path, the exposure lenses including at least two lenses disposed at positions different from one another on the optical path; a magnification changer for changing magnification of the exposure lenses; and an aperture disposed between the positions at or in the vicinity position at which a far-field pattern is formed by the emitted light beams, the aperture having an opening which transmits only a portion of luminous flux of the light beams therethrough, and an opening area changer which changes area of the opening of the aperture in accordance with magnification, wherein the exposure lenses include lenses for changing the magnification disposed between the aperture and the exposure surface.

In accordance with the fourth aspect of the present invention, of the group of lenses, the lens system for changing the magnification is arranged between the aperture and the exposure surface. Accordingly, by using the opening area changing means to change the opening area of the aperture substantially linearly in accordance with the specified magnification, the opening area is changed in accordance with the magnification, and so an appropriate depth of focus can be maintained for all magnifications.

The opening area changing means may be a mechanism which mechanically works together with the magnification changing means.

There is an interrelationship between the amounts by which the magnification of the lens system and the opening area of the aperture are changed. Therefore, the lens system and the opening area of the aperture can be made to both change together, for example, by mechanically interlinking with gears of a specified gear ratio.

DESCRIPTION OF THE PREFERRED EMBODIMENTS

Figure 3:
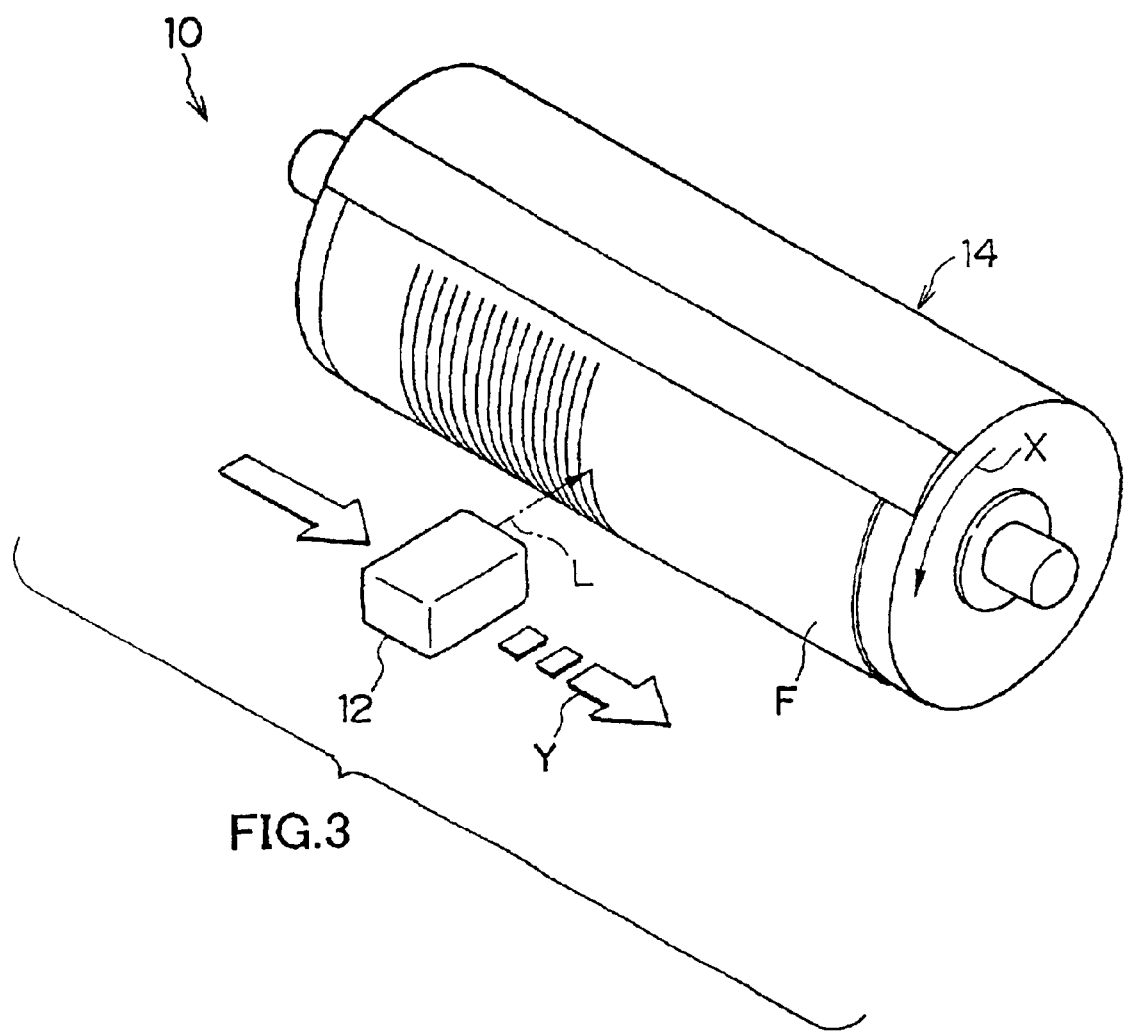
FIG. 3 shows a schematic view of an image recording device according to an embodiment of the present invention.

FIG. 3 shows an image recording device 10 according to an embodiment of the present invention.

The image recording device 10 is structured so as to record an area modulation image by irradiating a laser beam (or laser beams) L outputted from an exposure head 12 onto a recording film F (photosensitive material) that is attached to a drum 14.

A two-dimensional image is formed on the recording film F by the drum 14 rotating in a direction of arrow X (main-scanning direction) and the exposure head 12 moving in a direction of arrow Y (sub-scanning direction). Further, area modulation image is an image in which picture elements are formed on the recording film F by on-off control of the laser beam L, and predetermined gradation can be obtained on the basis of the area taken up by the picture elements.

Figure 4:
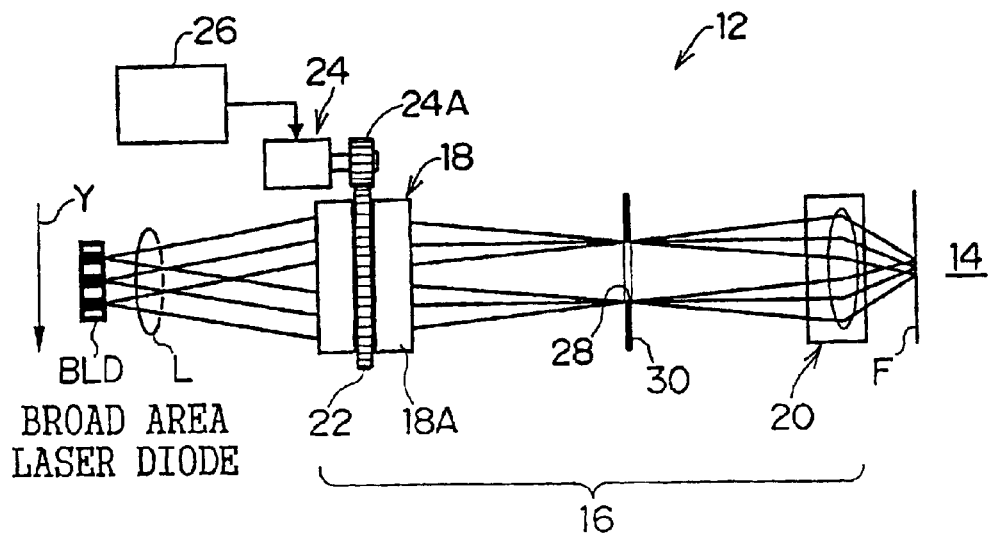
FIG. 4 shows a schematic structural view of an exposure head.

As shown in FIG. 4, the exposure head 12 comprises a semiconductor laser BLD (Broad area Laser Diode) which outputs the laser beam L and which is arranged such that a broad area direction and the sub-scanning direction substantially correspond to each other, and a converging (condensing) optical system 16 in which a near-field pattern image and a far-field pattern image of the light which is outputted from the semiconductor BLD are formed onto the recording film F.

The semiconductor laser BLD is formed by an index guide-type semiconductor laser, for example, and is provided with an active layer between a p-type semiconductor substrate and an n-type semiconductor substrate. The active layer is structured so as to output the laser beam L by applying a predetermined voltage between electrodes which are disposed respectively at the p-type semiconductor substrate and the n-type semiconductor substrate.

The semiconductor laser BLD according to the present embodiment has multiple (three in this embodiment) light emitting points for emitting three laser beams at the same time. These three laser beams form a row in the sub-scanning direction.

The condensing optical system 16 has a zoom switching lens (CL) 18 which changes magnification of the outputted laser beams L, and a focus lens (SL) 20 which is disposed facing and close to the recording film F, and which focuses the laser beam L outputted from the semiconductor laser BLD onto the recording film F with a predetermined spot diameter.

The zoom switching lens 18 is formed by a group of lenses (not shown). A relative positional relationship between the lenses is changed, and magnification of the zoom switching lens 18 is thereby changed, thus allowing a distance between the spots formed by the three laser beams L on the recording film F to be changed.

When an image is recorded on the recording film F, if it is desired to change a resolution at which the image is recorded, sub-scanning pitches should be changed. In this case, since the semiconductor laser BLD is formed by a multi-beam (three laser beams in the present embodiment), it is necessary to change the distance between the spots formed by the three simultaneously irradiated laser beams L.

A gear 22 is provided on a casing 18A of the zoom switching lens 18. The gear 22 is connected to a mechanism at the interior of the zoom switching lens 18 (not shown) for moving the lenses in an axis direction thereof. Rotation of the gear 22 enables the magnification of the zoom switching lens 18 to be changed.

A pinion gear 24A, which is mounted to a drive shaft of a motor 24, meshes with the gear 22. Further, the motor 24 is controlled to drive in response to signals from a control circuit 26, thus enabling the magnification of the zoom switching lens 18 to be changed.

The focus lens 20 is arranged so as to adjust its focusing position to the recording film F, and thereby focuses the laser beams L which are transmitted from the zoom switching lens 18 onto the recording film F in a state in which an aperture 30 is closed to a predetermined spot diameter.

In the present embodiment, the aperture 30, which has a predetermined opening 28 formed threat, is arranged at a position at which a far-field pattern is formed on the optical paths of the laser beams L transmitted from the zoom switching lens 18, or in the vicinity of the far-field pattern.

Figure 5:
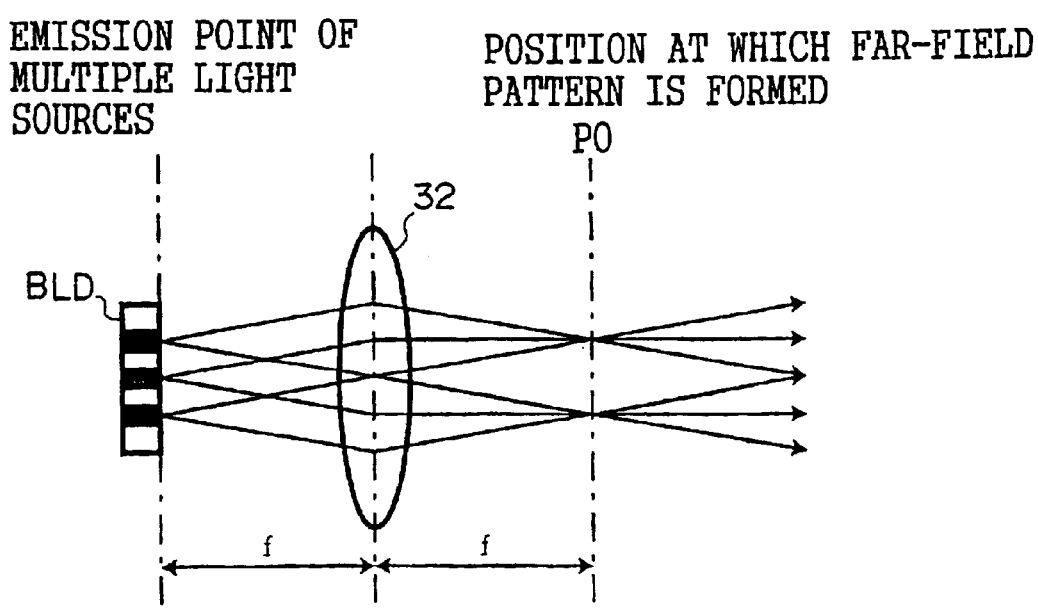
FIG. 5 shows a model view of an optical system for illustrating a position at which a far-field pattern is formed.

As shown in FIG. 5, the far-field pattern is formed at a position of a distance f, which is the same as a focal length f between the semiconductor laser BLD and a lens (which is shown as a single collimator lens 32 in FIG. 5). At the zoom switching lens 18, the group of lenses is moved so as to change the magnifications while the relationship between the lengths described above is maintained.

Figure 6A:
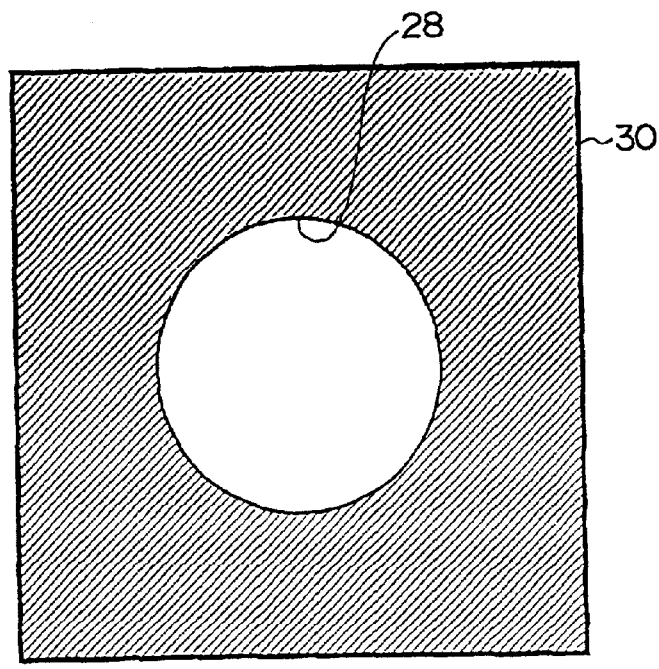
FIG. 6A is a front view of an aperture applied in an embodiment of the present invention.
Figure 6B:
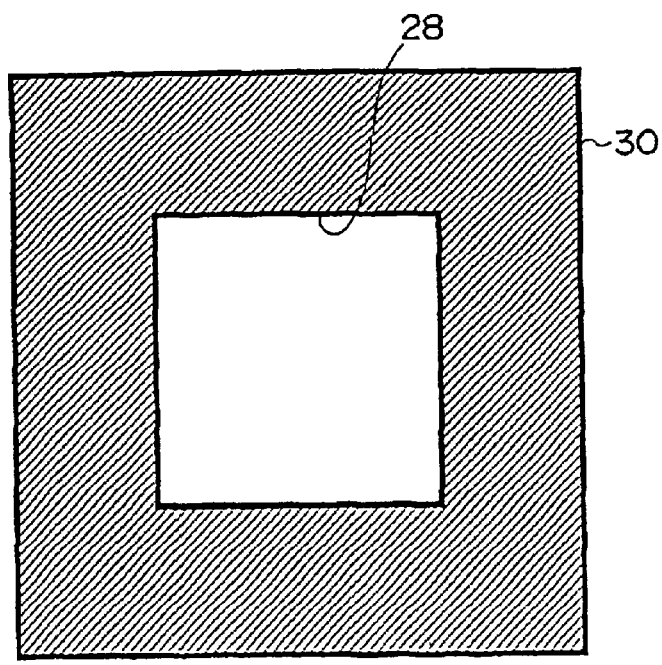
FIG. 6B is a front view illustrating a variant example of the aperture.

The aperture 30 is formed in a shape of a rectangular shield plate, and has the circular-shaped opening portion 28 formed at the center thereof (see FIG. 6A). A core axis of this opening portion 28 and the optical axis of a luminous flux (a collective body of the three laser beams L) correspond to each other. Further, the zoom switching lens 18 is disposed between the aperture 30 and the semiconductor laser BLD. Moreover, the opening portion 28 of the aperture 30 is not limited to a circular shape, and can be formed as a rectangular shape as shown in FIG. 6B or another polygon shape.

The opening portion 28 is formed slightly smaller than the luminous flux region. Consequently, due to the periphery of the thus formed opening portion 28, a portion (trim portion) of the luminous flux is shielded by the aperture 30. That is, the luminous flux region that reaches the focus lens 20 can be the same at either high resolution or low resolution. Therefore, by using the focus lens 20, a converging angle at which the laser beams L are condensed onto the recording film F is kept constant.

Operation of the present embodiment will be explained hereinafter.

When an image is to be recorded at low resolution, a signal is outputted from the control circuit 26 so as to move the group of lenses in the zoom switching lens 18 to a predetermined position. When this signal is outputted to the motor 24, the motor 24 begins to drive, and the gear 22 begins to be rotated via the pinion gear 24A.

The group of lenses at the interior of the zoom switching lens 18 is moved mechanically together with the rotation of the gear 22, thus enabling the magnification of the group of lenses to correspond to the low resolution.

In this state, the three laser beams L are simultaneously outputted from the semiconductor laser BLD, and transmitted to the focus lens 20 through the zoom switching lens 18. At the focus lens 20, each of the laser beams L is focused on the recording film F which is wrapped around the drum 14, with a predetermined spot diameter.

The drum 14 rotates at a predetermined speed (main-scans). In accordance with this rotation, the exposure head 12 moves in the axis direction of the drum 14 (sub-scans), and a two-dimensional image is formed on the recording film F by scanning of the laser beams L.

Further, when an image is recorded at low resolution, the amount of the luminous flux that is shielded by the aperture 30 is smaller than when an image is recorded at high resolution. In this case, almost all of the luminous flux is condensed by the focus lens 20 at a predetermined converging angle.

When an image is to be recorded at high resolution, speed in a sub-scanning direction is made lower than when an image is recorded at low resolution, in accordance with the desired resolution. Further, speed in a main-scanning direction can be controlled by electrically increasing the modulation frequency of signals outputted from the control circuit 26. When the laser beam L is a single beam, the speed in the sub-scanning direction can be controlled by decreasing the speed at which the exposure head 12 moves. However, in the present embodiment, since the three laser beams L for emitting simultaneously are used, the speed in the sub-scanning direction can be controlled by changing (making shorter) the distance between the spots formed by the three laser beams L.

Therefore, on the basis of a signal from the control circuit 26, the group of lenses at the interior of the zoom switching lens 18 is moved and then changed to a predetermined magnification (adjusted to a high magnification).

In order to record an image at high resolution, when the zoom switching lens 18 is adjusted so as to have a higher magnification, the converging angle is larger, and the depth of focus is correspondingly shorter. Therefore, the condensing optical system 16 and the drum 14 must be positioned relative to each other with a higher accuracy (see FIG. 9).

In the present embodiment, a region of the luminous flux corresponding to an amount by which the converging angle becomes larger is shielded by the aperture 30. The luminous flux that reaches the focus lens 20 is made to be substantially the same as when an image is recorded at low resolution. Consequently, the converging angle is prevented from becoming larger, thus making it possible to obtain a depth of focus the same as that when an image is recorded at low resolution.

When a portion of the luminous flux is shielded by the aperture, a problem pertaining to deterioration in the light amount is caused. This has been explained in the "Summary of the Invention" of the present application. However, a more detailed description will be given hereinafter.

Figure 1:
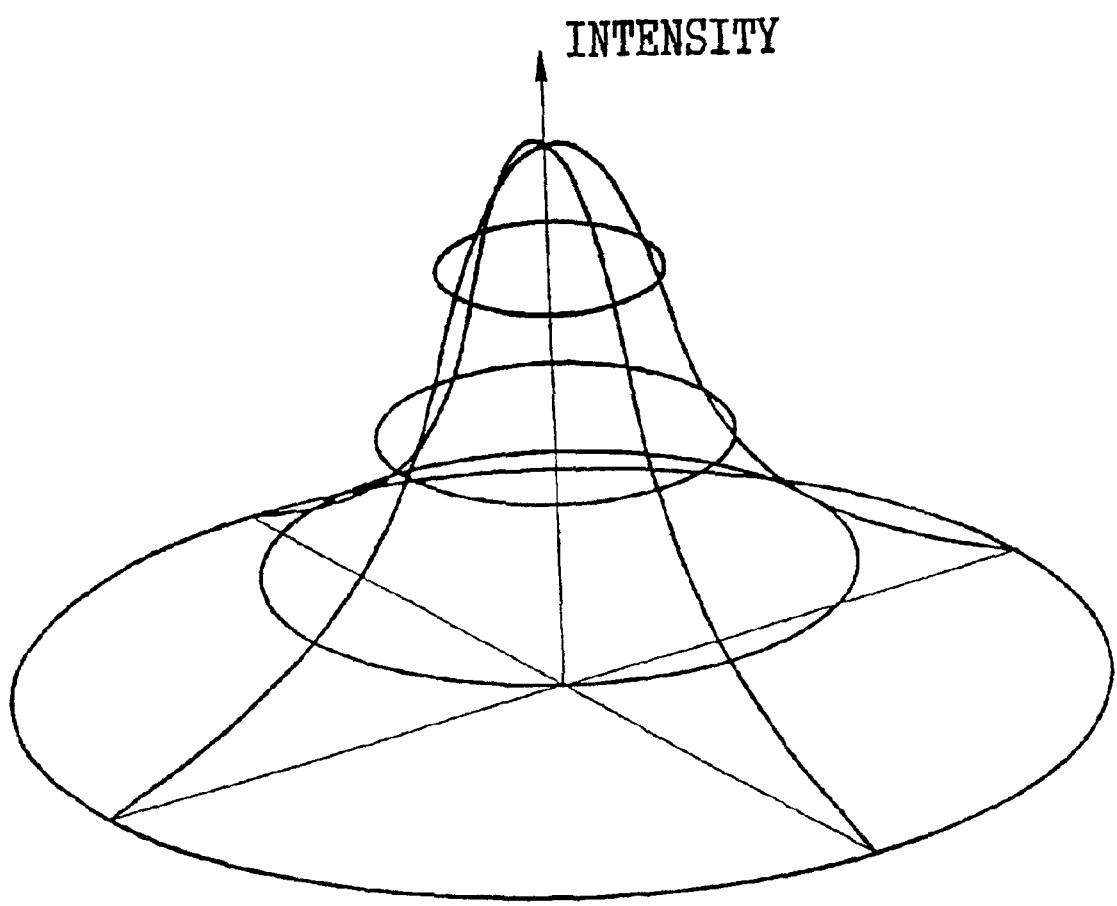
FIG. 1 is an explanatory view in which a light intensity distribution on a far-field pattern is shown as a three-dimensional model.

Intensity distribution of the laser beam L at a position at which the aperture 30 is arranged is shown in FIG. 1, for example, and the intensity distribution has a mountain like characteristic whose central portion is the highest intensity and which deteriorates toward a periphery (foot of the maintain). The region of the portion of the luminous flux that is shielded by the aperture 30 corresponds to a trim portion of this intensity distribution. Thus, even when the peripheral edge portion of the intensity distribution is shielded by the aperture 30, the total light amount does not decrease in direct proportion to the area shielded by the aperture 30.

Figure 2:
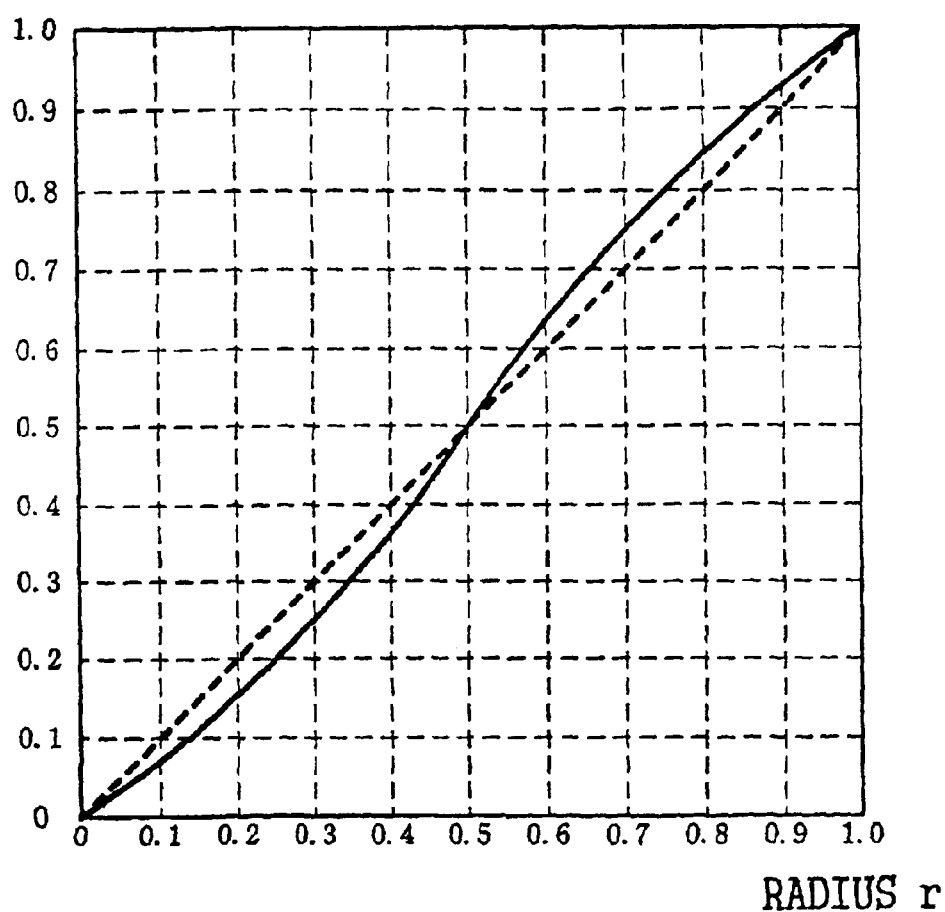
FIG. 2 shows a characteristic graph that represents a relationship between an opening diameter (radius) and a transmissivity ($1/e^2$ is normalized to 1) of an aperture.

As shown in FIG. 2, assuming a Gaussian distribution, a radius of the opening portion 28 of the aperture 30 arranged on the optical path of r, a light amount of $1/e^2$, and a radius r and light transmissivity T both normalized as 1, when the aperture 30 opens at a radius r other than 1, a light amount ratio of the radius r to the light transmissivity T has a relationship close to a direct proportion (see the dot line of FIG. 2). For example, when the radius r is ½ (i.e., the area is ¼), the light amount is also ½.

Accordingly, when, in order to record an image at high resolution, the magnification is changed such that a range of the luminous flux (a cross-sectional radius) at a position where the aperture 30 is arranged is doubled (four times the area) and this region of the enlarged luminous flux in excess of that when an image is recorded at low resolution is shielded by the aperture 30, the light amount deteriorates only by ½.

On the other hand, when an image is to be recorded at high resolution, the sub-scanning speed becomes lower (in the case of low resolution being ½ the high resolution, the speed is also ½) than when the image is recorded at low resolution, and the sub-scanning time is doubled such that the light amount is halved. Consequently, the exposure amount exposed onto the recording film F does not change.

Figure 7:
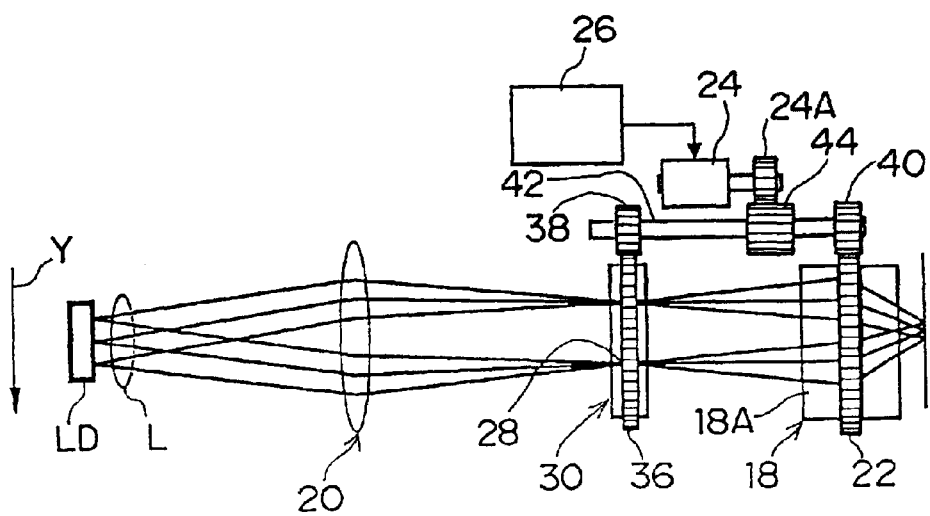
FIG. 7 is a schematic structural view of an exposure head according to another embodiment of the present invention.
Figure 8A:
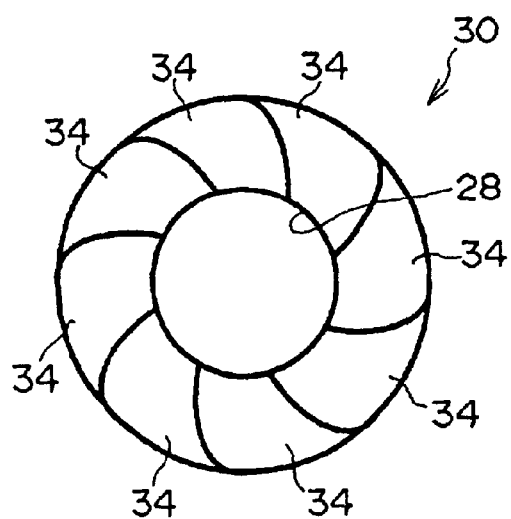
FIG. 8A is a front view of an aperture that is applied in a variant example.
Figure 8B:
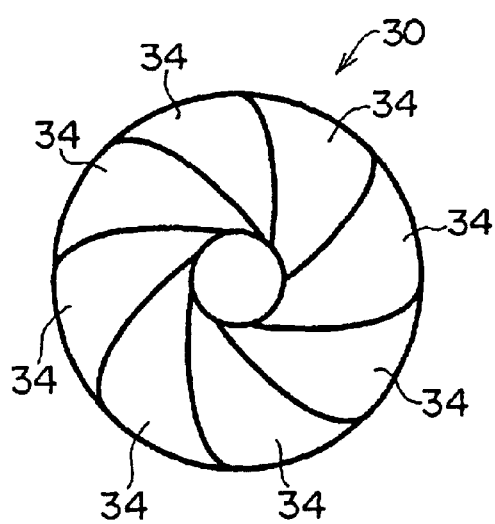
FIG. 8B is a front view of the aperture that is applied in the variant example.
Figure 9A:
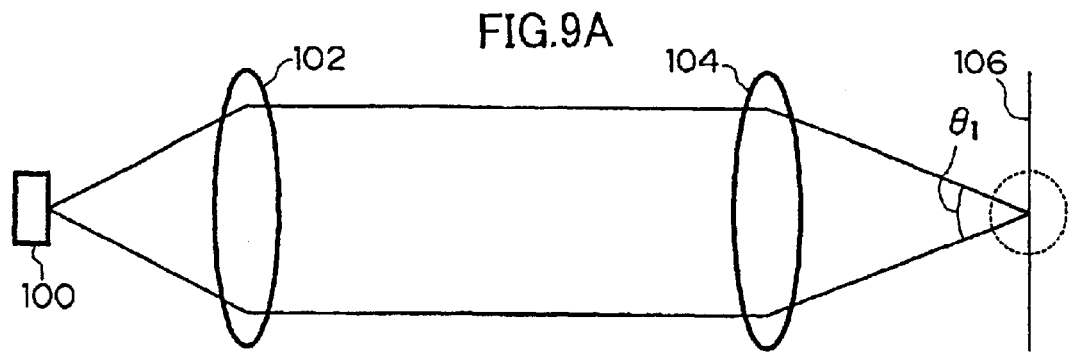
FIG. 9A is a schematic view illustrating a state in which a converging angle changes in accordance with a change of magnification.
Figure 9B:
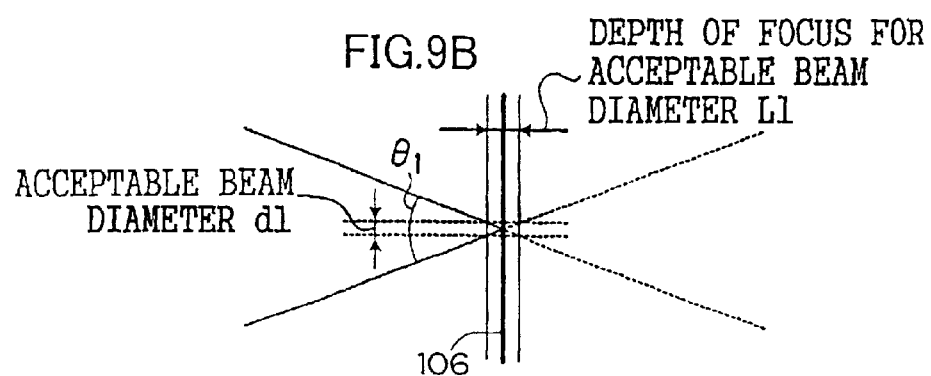
FIG. 9B is a schematic view illustrating the state in which the converging angle changes in accordance with the change of magnification.
Figure 9C:
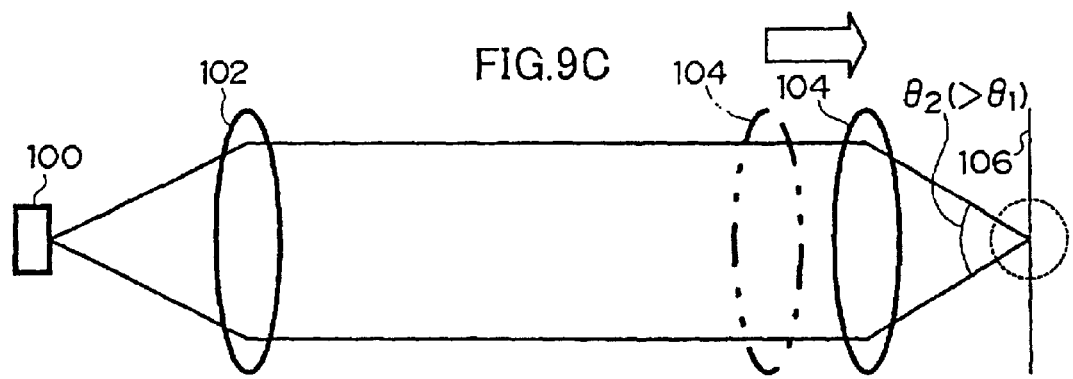
FIG. 9C is a schematic view illustrating the state in which the converging angle changes in accordance with the change of magnification.
Figure 9D:
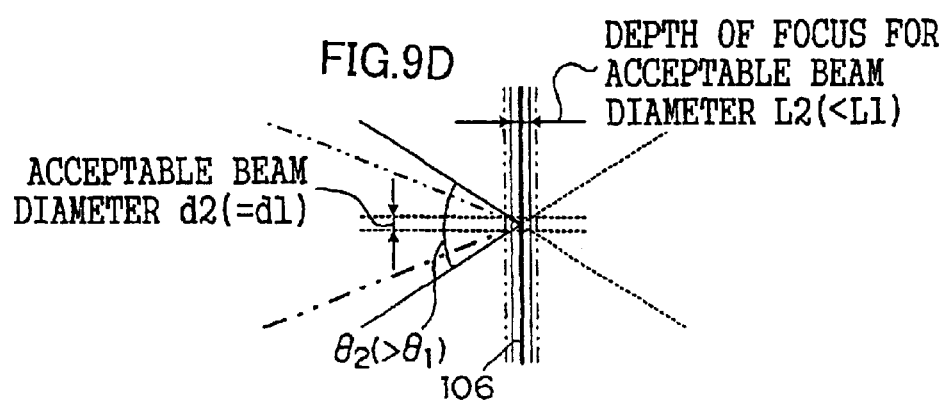
FIG. 9D is a schematic view illustrating the state in which the converging angle changes in accordance with the change of magnification.

In the present embodiment, the zoom switching lens 18 has been arranged between the aperture 30 and the semiconductor laser BLD but, as shown in FIG. 7, the zoom switching lens 18 may be arranged between the aperture 30 and the drum 14. In this arrangement, since the opening area of the opening portion 28 of the aperture 30 must be changed in accordance with the magnification, as shown in FIGS. 8A and 8B, the aperture 30 is formed by a combination of many spiral-form plates 34, and is able to change the opening area of the opening portion 28 by rotation of each spiral-form plate 34.

Further, a gear 36 is mounted on a peripheral edge of the spiral-form plates 34. By rotation of the gear 36, the opening area can be changed. The gear 36 meshes with a gear 38. The gear 38 is mounted to a shaft 42 so as to be coaxial with a gear 40. The gear 40 meshes with the gear 22 for changing the magnification of the zoom switching lens 18. A gear 44 is mounted to a portion of this shaft 42, and meshes with the pinion gear 24A of the motor 24. A gear ratio relationship of the gear 38 to the gear 40 is predetermined. When the motor 24 is driven, each of the gear 38 and the gear 40 can bring about an appropriate state (obtaining a relationship between the magnification and the opening portion 28 of the aperture 30).

As described above, in the present embodiment, multiple laser beams (three) are emitted simultaneously. When an image is formed (exposed) onto the recording film F which is wrapped around the drum 14, in accordance with a desired resolution, the aperture 30 is arranged on the optical path at a position at which the far-field pattern is formed or at a position in the vicinity of the far-field pattern position. This aperture 30 is provided with the opening portion 28. When an image is recorded at low resolution, almost all of the luminous flux that is outputted from the zoom switching lens 18 can be transmitted through the opening portion 28. In this state, when, in order to record an image at high resolution, magnification is enlarged by the zoom switching lens 18, the luminous flux is enlarged and the converging angle formed by the focus lens 20 is also enlarged. However, since the aperture 30 shields the luminous flux in accordance with the amount by which this converging angle was enlarged, the converging angle is the same as when the image is recorded at low resolution, so the depth of focus can be maintained.

When an image is recorded at high resolution, since the speed in the sub-scanning direction is low, amount with which the image is exposed onto the recording film F (duration×light amount) does not change, so image quality is not affected by the arrangement of the aperture 30.

In this specification, a description of a case in which the BLD light sources are arranged in an array has been made, but a fiber array in a multi-row array can be used in place of the BLD light sources. In this case, a single row array mode LD can be used as a light source incident upon the fibers, or a BLD can be used.

As described above, an excellent effect of the present invention is to provide a scanning optical system having a simple structure, capable of preventing depth of focus from decreasing when magnification of the optical system is changed, especially when the magnification is increased, and capable of scanning while maintaining a range of allowable spot diameter for all magnifications.

Another excellent effect of the present invention is to provide an image recording exposure device which has an optical system for simultaneously scanning multiple light beams and in which, even with a change of resolution, the depth of focus can be maintained without causing a reduction of light amount, such that a spot diameter being scanned on a recording surface is kept within an acceptable range.

What is claimed is:

1. An optical system for use in scanning a surface, the optical system comprising:

a light source including a broad light emission area in at least one direction;

a group of lenses which condenses a light beam emitted from the light source to a surface to be scanned;

a magnification changer for changing magnification of the group of lenses; and an aperture disposed at or in the vicinity of a far field pattern position on an optical path of the light beam and having an opening in which only a portion of the light beam is transmitted therethrough and wherein a focusing spot of the light beam on the surface to be scanned does not depend upon a size of the aperture in the at least one direction.

2. The optical system of claim 1, wherein the light source is capable of emitting multiple light beams simultaneously.

3. The optical system of claim 2, wherein the group of lenses comprises one lens group movable along an optical axis direction for changing the magnification, with the aperture disposed downstream of said one lens group relative to the optical path, and area of the aperture opening being constant.

4. The optical system of claim 2, wherein the group of lenses comprises one lens group movable along an optical axis direction for changing the magnification, with the aperture disposed upstream of said one lens group relative to the optical path, and area of the aperture opening changing in accordance with the magnification.

5. The optical system of claim 1, wherein the group of lenses comprises one lens group movable along an optical axis direction for changing the magnification, with the aperture disposed downstream of said one lens group relative to the optical path, and area of the aperture opening being constant.

6. The optical system of claim 1, wherein the group of lenses comprises one lens group movable along an optical axis direction for changing the magnification, with the aperture disposed upstream of said one lens group relative to the optical path, and area of the aperture opening changing in accordance with the magnification.

7. An optical system for use in scanning a surface, the optical system comprising:

a light source including a broad light emission in at least one direction;

a lens group which condenses a light beam emitted from the light source to a surface to be scanned;

a magnification changer which moves at least one lens of the lens group along an optical axis direction of the light beam for changing magnification of the lens group; and an aperture disposed at or in the vicinity of a far field pattern position on an optical path of the light beam and including an opening which transmits only a portion of the light beam therethrough and wherein a focusing spot of the light beam on the surface to be scanned does not depend upon a size of the aperture in the at least one direction.

8. The optical system of claim 7, wherein the light source is capable of emitting multiple light beams simultaneously.

9. The optical system of claim 8, wherein the group of lenses comprises one lens group movable along the optical axis direction for changing the magnification, with the aperture disposed downstream of said one lens group relative to the optical path, and area of the aperture opening being constant.

10. The optical system of claim 8, wherein the group of lenses comprises one lens group movable along an optical axis direction for changing the magnification, with the aperture disposed upstream of said one lens group relative to the optical path, and area of the aperture opening changing in accordance with the magnification.

11. The optical system of claim 7, wherein the group of lenses comprises one lens group movable along an optical axis direction for changing the magnification, with the aperture disposed downstream of said one lens group relative to the optical path, and area of the aperture opening being constant.

12. The optical system of claim 7, wherein the group of lenses comprises one lens group movable along the optical axis direction for changing the magnification, with the aperture disposed upstream of said one lens group relative to the optical path, and area of the aperture opening changing in accordance with the magnification.

13. An image recording exposure device for recording an image on an exposure surface by simultaneously carrying out multiple main-scans on the exposure surface, the device comprising:

point-like light sources arranged in a row in a sub-scanning direction and capable emitting multiple light beams simultaneously;

exposure lenses including multiple lenses for focusing light beams emitted from the light sources onto the exposure surface along an optical path, at least two exposure lenses being disposed at positions different from one another on the optical path;

a magnification changer for changing magnification of the exposure lenses; and an aperture disposed between said positions at or in the vicinity position at which a far-field pattern is formed by the emitted light beams, the aperture having an opening of constant area which transmits only a portion of luminous flux of the light beams therethrough, wherein the exposure lenses include lenses for changing the magnification disposed between the aperture and the light sources.

14. The image recording exposure device of claim 13, wherein the aperture is maintained at a substantially constant distance from the light sources.

15. The image recording exposure device of claim 13, wherein the aperture is maintained at a substantially constant distance from the exposure surface.

16. The image recording exposure device of 13, wherein the opening of the aperture is non-circular.

17. An image recording exposure device for recording an image on an exposure surface by simultaneously carrying out multiple main-scans on the exposure surface, the device comprising:

point-like light sources arranged in a row in a sub-scanning direction and capable emitting multiple light beams simultaneously;

exposure lenses including multiple lenses for focusing light beams emitted from the light sources onto the exposure surface along an optical path, the exposure lenses including at least two lenses disposed at positions different from one another on the optical path;

a magnification changer for changing magnification of the exposure lenses; and an aperture disposed between said positions at or in the vicinity position at which a far-field pattern is formed by the emitted light beams, the aperture having an opening which transmits only a portion of luminous flux of the light beams therethrough, and an opening area changer which changes area of said opening of the aperture in accordance with magnification, wherein the exposure lenses include lenses for changing the magnification disposed between the aperture and the exposure surface.

18. The image recording exposure device of claim 17, wherein the opening area changer comprises a mechanism which is mechanically linked with the magnification changer.

19. The image recording exposure device of claim 17 wherein the aperture is maintained at a substantially constant distant from the light sources.

20. The image recording exposure device of claim 17, wherein the aperture is maintained at a substantially constant distance from the exposure surface.

* * * * *